(12) United States Patent
Mauder et al.

(10) Patent No.: US 9,275,862 B2
(45) Date of Patent: Mar. 1, 2016

(54) COMPENSATION DEVICES

(71) Applicant: Infineon Technologies Austria AG, Villach (AT)

(72) Inventors: Anton Mauder, Kolbermoor (DE); Hans Weber, Bayerisch Gmain (DE); Klemens Pruegl, Regensburg (DE)

(73) Assignee: Infineon Technologies Austria AG, Villach (AT)

( * ) Notice: Subject to any disclaimer, the term of this patent is extended or adjusted under 35 U.S.C. 154(b) by 64 days.

(21) Appl. No.: 13/891,947

(22) Filed: May 10, 2013

(65) Prior Publication Data

US 2014/0332931 A1 Nov. 13, 2014

(51) Int. Cl.
| | |
|---|---|
| *H01L 21/425* | (2006.01) |
| *H01L 21/02* | (2006.01) |
| *H01L 21/265* | (2006.01) |
| *H01L 21/225* | (2006.01) |
| *H01L 21/266* | (2006.01) |
| *H01L 21/762* | (2006.01) |
| *H01L 21/66* | (2006.01) |
| *H01L 29/06* | (2006.01) |
| *C30B 25/02* | (2006.01) |

(52) U.S. Cl.
CPC .......... *H01L 21/02694* (2013.01); *C30B 25/02* (2013.01); *H01L 21/2253* (2013.01); *H01L 21/265* (2013.01); *H01L 21/266* (2013.01); *H01L 21/26513* (2013.01); *H01L 21/76237* (2013.01); *H01L 22/12* (2013.01); *H01L 22/20* (2013.01); *H01L 29/0688* (2013.01); *H01L 22/14* (2013.01)

(58) Field of Classification Search
CPC ............... H01L 51/002; H01L 21/823807; H01L 21/761; H01L 29/0646; H01L 29/7802; H01L 29/7813; H01L 29/7396; H01L 29/66734; H01L 21/265; H01L 21/266; H01L 21/26513; H01L 21/76237; H01L 21/2253
USPC ......... 438/222, 268, 270, 306, 546, 514, 516, 438/524
See application file for complete search history.

(56) References Cited

U.S. PATENT DOCUMENTS

| | | | |
|---|---|---|---|
| 2003/0209750 A1* | 11/2003 | Deboy et al. .................. | 257/301 |
| 2010/0148255 A1* | 6/2010 | Fuernhammer et al. ...... | 257/342 |
| 2012/0189239 A1* | 7/2012 | Tu et al. .......................... | 385/2 |
| 2013/0001674 A1* | 1/2013 | Schulze et al. ................ | 257/329 |
| 2014/0001514 A1* | 1/2014 | Schulze et al. ................ | 257/190 |
| 2014/0246697 A1* | 9/2014 | Schulze et al. ................ | 257/192 |
| 2014/0327069 A1* | 11/2014 | Willmeroth et al. .......... | 257/329 |

OTHER PUBLICATIONS

Moens, P., et al., "UltiMOS: A Local Charge-Balanced Trench-Based 600V Super-Junction Device," Preoceedings of the 23$^{rd}$ International Symposium on Power Semiconductor Devices & IC's, May 23-26, 2011, pp. 304-307, San Diego, California.

* cited by examiner

*Primary Examiner* — Minh-Loan Tran
(74) *Attorney, Agent, or Firm* — Slater & Matsil, L.L.P.

(57) ABSTRACT

Methods, apparatuses and devices related to the manufacturing of compensation devices are provided. In some cases, an n/p-codoped layer is deposited for calibration purposes to minimize a net doping concentration. In other cases, alternatingly n- and p-doped layers are then deposited. In other embodiments, an n/p-codoped layer is deposited in a trench where n- and p-dopants have different diffusion behavior. To obtain different doping profiles, a heat treatment may be performed.

10 Claims, 6 Drawing Sheets

COMPENSATION DEVICES

TECHNICAL FIELD

The present application relates to compensation devices and to methods and apparatuses usable for manufacturing such compensation devices.

BACKGROUND

Compensation devices, for example, metal oxide semiconductor field effect transistors using compensation regions, have been increasingly investigated as devices for power applications. In such devices, for example, alternating vertical p- and n-doped semiconductor regions are used which on the one hand should be highly doped to provide a low resistance when the device is conducting and on the other hand should compensate each other as precisely as possible to ensure a good blocking ability, for example, to avoid a breakthrough of the device like an avalanche breakthrough even at higher voltages when the device is non-conducting before a rated blocking voltage is reached. Compensating in this case essentially means that an overall effective n-doping should correspond as precisely as possible to an effective overall p-doping, for example, an effective overall p-doping adjacent to the n-doping.

To this end, conventionally sources for n- and p-doping each have been calibrated separately prior to depositing n- and p-doped layers. However, for some applications the precision of the compensation obtained in this way may not be sufficient to obtain a desired blocking behavior, for example, voltages of up to 600 V or more.

In the following, embodiments will be described in detail with reference to the attached drawings. These embodiments serve as examples only and are not to be construed as limiting the scope of the present application. For example, while embodiments may be described having a plurality of features, other embodiments may comprise less features and/or alternative features. Furthermore, features from different embodiments may be combined with each other unless specifically noted otherwise.

DETAILED DESCRIPTION OF ILLUSTRATIVE EMBODIMENTS

Various embodiments relate to the manufacturing of compensation devices and to corresponding compensation devices. Compensation devices as already explained in the background are generally to be understood as devices where n-doped and p-doped regions are provided on a substrate, for example, a semiconductor substrate, the amount of n-doping substantially matching the amount of p-doping. Since for technical systems fluctuations and deviations from a target value are common or sometimes even inevitable, compensation devices may be defined as devices where the absolute value of the difference of acceptor charge density in a semiconductor device and donor charge density in the semiconductor device is below a predefined limit. For example, for a semiconductor device with a certain blocking capability the upper limit for this absolute value may be $1.4 \times 10^{14}/cm^3$ or up to $2 \times 10^{14}/cm^3$. For higher blocking voltages, this absolute value decreases. Therefore, the predefined limit may depend on device requirements.

Figure 1:
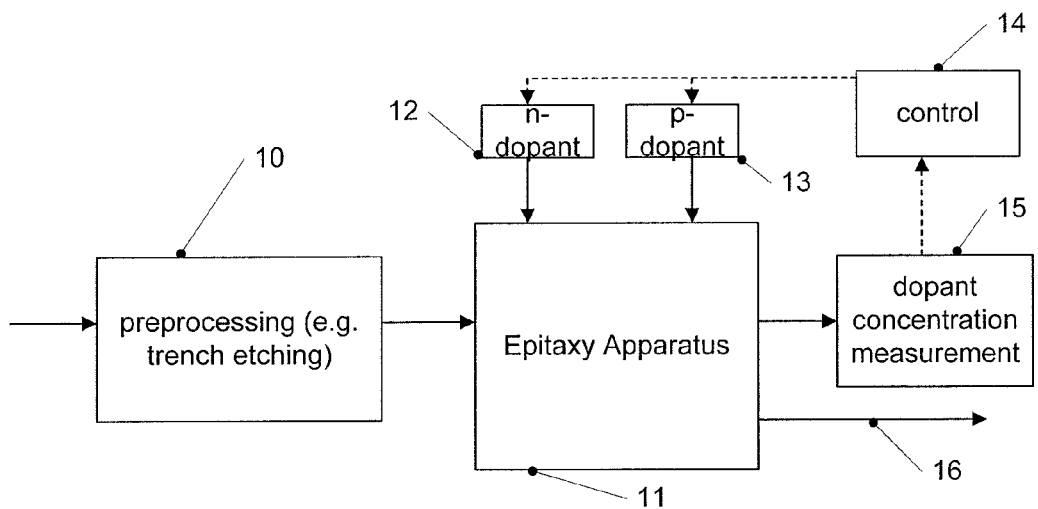
FIG. 1 shows a schematic block diagram of an apparatus according to an embodiment.

In FIG. 1, the block diagram of an apparatus according to an embodiment is shown. It should be noted that while the apparatus of FIG. 1 is shown as having a plurality of components, the representation of FIG. 1 does not imply any specific spatial relationship between the components. Some components may even be located remote from each other, and for example, substrates to be processed may be transferred between the components also over larger distances.

The apparatus of FIG. 1 is configured to process substrates as part of a manufacturing process for compensation devices. Additionally, in some embodiments the apparatus of FIG. 1 may also be used to manufacture other devices than compensation devices in conventional manufacturing processes. A controller 14, for example, a microprocessor-based control like a computer, may be used to control the apparatus and for example switch the apparatus from manufacturing compensation devices to manufacturing other devices in such cases.

Furthermore, the apparatus of FIG. 1, as will be explained in detail below, may be operated in a calibration mode and in a production mode.

In the calibration mode, a substrate for calibration purposes is supplied to an epitaxy apparatus 11. The substrate may be an unprocessed substrate used, for example, for calibration purposes only or may also be a preprocessed substrate, for example, preprocessed in a preprocessing device 10 to be described later in greater detail, to make the substrate used for calibration purposes resemble substrates supplied later to epitaxial apparatus 11 in production mode.

Epitaxy apparatus 11 may, for example, be a chemical vapor deposition (CVD) apparatus, like a LPCVD (low pressure chemical vapor deposition), an APCVD (atmospheric pressure chemical vapor deposition) a MOCVD (metal organic chemical vapor deposition) or a PECVD (plasma enhanced chemical vapor deposition) apparatus. As these deposition techniques per se are conventional techniques, they will not be described further herein. Other epitaxy techniques like MBE (molecular beam epitaxy) may also be used in other embodiments.

Epitaxy apparatus 11 has an n-dopant source 12 and a p-dopant source 13 associated therewith. For example, in case of a CVD apparatus corresponding precursor gases for n-doping may be supplied by n-dopant source 12, and corresponding precursor gases for p-doping may be supplied by p-dopant source 13. For example, for silicon based processes where, for example, a silicon wafer is used as a substrate, typical n-dopants may include phosphorous (P), arsenic (As) or antimony (Sb), and typical p-dopants may include for example boron (B) or aluminum (Al).

For calibration, in some embodiments control 14 may control n-dopant source 12 and p-dopant source 13 as well as epitaxy apparatus 11 to deposit an epitaxy layer which is both n- and p-doped in nominally (e.g., according to a last calibration) the same amount to manufacture a compensated layer. The overall dopant concentration is then measured in a dopant concentration measurement device 15, for example, by measuring a surface resistance of the thus deposited calibration layer. In case the net doping is below a predetermined threshold, the calibration is finished. In case of predominant n-dopant, for a next calibration layer using, e.g., a new substrate for example, the n-dopant concentration is reduced and/or the p-dopant concentration is increased. Likewise, if it turns out that the calibration layer has a net p-doping, the p-dopant concentration may be reduced and/or the n-dopant concentration may be increased. In other words, the dopant amounts are adjusted relative to each other to improve compensation. This process is repeated until the calibration process is finished, i.e., the net doping (difference between n-doping and p-doping) is below a predetermined threshold. The predetermined threshold may be, for example, below $2\times10^{14}/cm^3$, below $1.5\times10^{14}/cm^3$ or below $1\times10^{14}/cm^3$, although other values may be used as well. The threshold used may, for example, be chosen depending on the requirements of the compensation device to be manufactured later.

Figure 10:
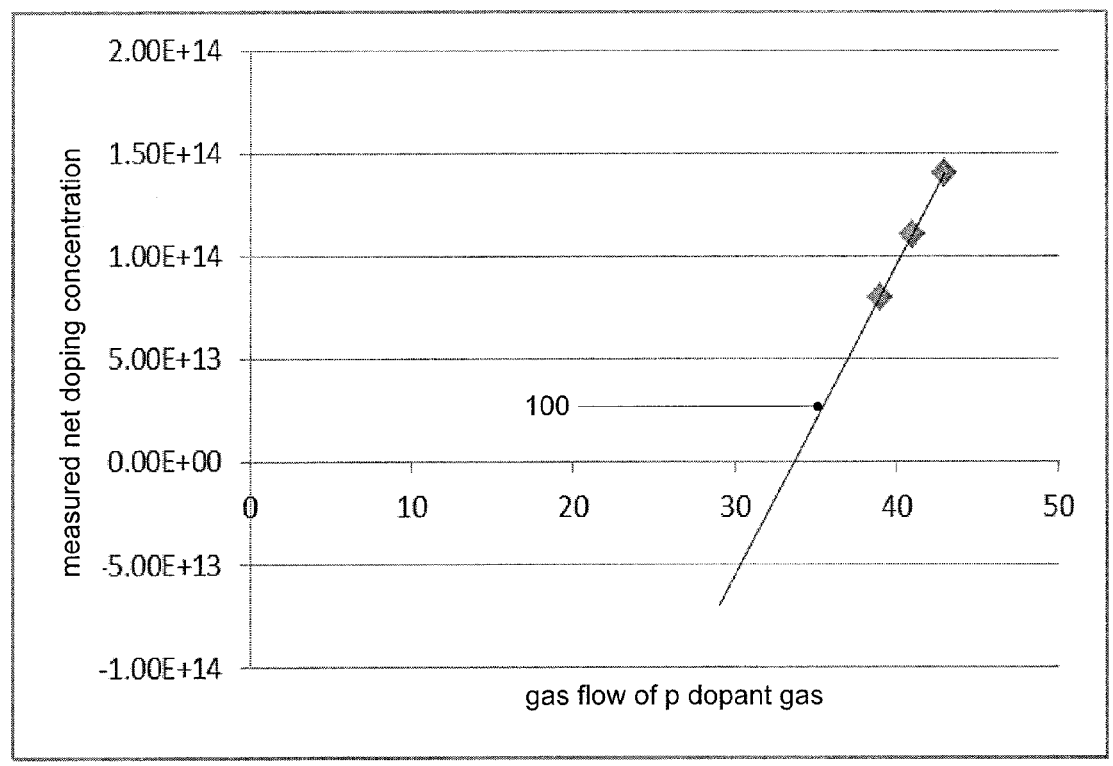
FIG. 10 shows an example for a calibration.

In other embodiments, for calibration control 14 may control n-dopant source 12 and p-dopant source 13 as well as epitaxy apparatus 11 to deposit epitaxy layers on a series of wafers which are both n- and p-doped, one of the dopant concentrations (n or p) being higher than the other dopant concentration (p or n), and at least one of the dopant concentrations (p or n) varying from wafer to wafer in the series. For each wafer, the net dopant concentration is measured, and from the measurements a parameter like dopant gas flow to obtain compensation doping (i.e., net doping below a predefined threshold) may be extrapolated, for example, by linear extrapolation. An example for such a measurement is shown in FIG. 10. In this simple example, n-dopant gas was supplied to a CVD reactor with a flow rate of 50 sccm (standard cubic centimeters per minute) and a certain preselected, dilution in a carrier gas like, e.g., hydrogen. For three different test wafers, p-dopant gas was supplied at flow rates of 43 sccm, 41 sccm and 39 sccm at a certain, e.g., preselected dilution that may be the same or different from that of the n-dopant gas, such that for all test wafers in the example the resulting p-doping was higher than the n-doping. The net doping concentration was measured for all three wafers as net p-doping concentration at $1.4\times10^{14}/cm^3$, $1.1\times10^{14}/cm^3$ and $0.8\times10^{14}/cm^3$. In FIG. 10, the measured doping is plotted vs. the p-dopant gas flow. A line 100 fit to the measured point represents an extrapolation, and a point where line 18 crosses the horizontal (flow rate) axis represents a gas flow of the p-dopant gas for compensation, in the present example 33.67 sccm.

It should be noted that the above numerical values serve only for illustration purposes. Furthermore, more than three wafers or only two wafers may be used. In other embodiments, for calibration a higher n-doping concentration than p-doping concentration may be used. In yet other embodiments, for some wafers a higher n-doping concentration may be used, and for other wafers a higher p-doping concentration may be used. For example, a fixed n-doping concentration, as in the example of FIG. 10, may be used in cases where a conductivity of an n-path is important for a device to be manufactured.

After the calibration is complete, the apparatus of FIG. 1 may be used for manufacturing compensation devices. In particular, by calibrating the amount of n-dopant and p-dopant by measuring a codoped layer doped both with n-dopant and with p-dopant, a comparatively high precession regarding the compensation may be obtained. For manufacturing compensation devices, substrates like silicon wafers, other semiconductor wafers or other substrates may be preprocessed in preprocessing device 10. For example, a trench may be etched into the substrate as will be explained later in some more detail. Other conventional preprocessing like structuring, doping etc., may also be performed, for example, for manufacturing other portions of the compensation device and/or for manufacturing other devices than the compensation device on the same substrate. For manufacturing the compensation device, in some embodiments at least one n-doped layer and at least one p-doped layer may be deposited alternatingly in the device, the amount of n-doping corresponding to the amount of p-doping based on the above-described calibration. In some embodiments, when more than one n-doped layer and more than one p-doped layer are deposited in a trench, intermediate etching may be performed to remove all or some of the epitaxy layers from the bottom of the device such that, for example, each n-doped layer and/or each p-doped layer contacts the bottom of the trench and therefore the substrate. In some embodiments, first an n-doped layer and then a p-doped layer may be deposited, and only the p-doped layer at the bottom of the trench may be removed. In other embodiments, the order may be reversed. For this alternating deposition of n- and p-doped layers the parameters obtained in the calibration for supplying n-dopant and p-dopant may be used, leading to a good compensation. In other embodiments, a lateral device may be manufactured by depositing a desired number of n- and p-doped layers on a planar substrate, e.g., a semiconductor surface. Subsequently, contacting areas for source, drain and body in an area of a respective cell and a drain contact may be manufactured.

In other embodiments, an n/p-codoped layer may be deposited in this trench using the parameters obtained during calibration, and a subsequent heating may be performed. In some embodiments, n-dopant and p-dopant have different diffusion coefficients, leading to different n-dopant and p-dopant profiles and therefore to n-doped and p-doped regions. Illustrative examples for these possibilities will be described later. After the epitaxy has been performed, as indicated by an arrow 16 the substrate may be further processed to finish the device in a conventional manner. For example, electric contacts may be provided on the substrate.

Figure 2:
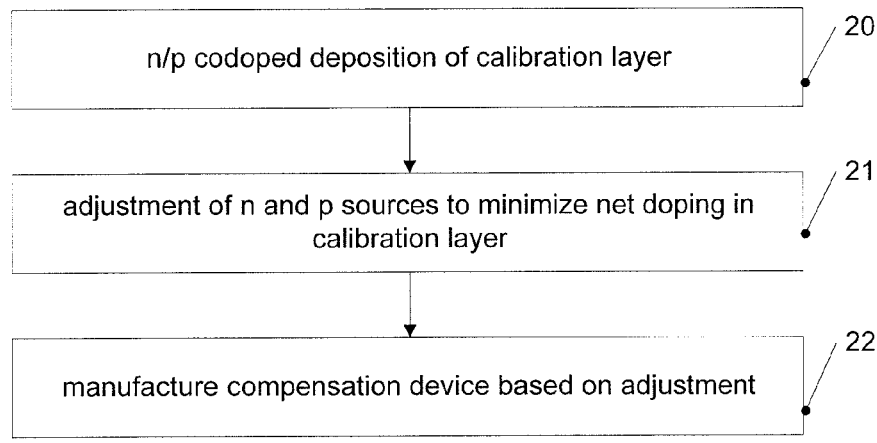
FIG. 2 shows a flowchart illustrating a method according to an embodiment.

In FIG. 2, a flowchart illustrating a method according to an embodiment is shown. While the method and other methods described later are described as a series of acts or events, the order of the acts or events shown is not to be construed as limiting, as in other embodiments acts or events may be performed in different orders, concurrently with each other or concurrently with other acts or events. Moreover, other embodiments may comprise less acts or events than shown in the figures and described in the following.

The method of FIG. 2 may, for example, be implemented in the apparatus of FIG. 1 and will be described referring to the previous description of FIG. 1. However, it is to be understood that also other apparatuses may be used to implement the method of FIG. 2.

At 20, a calibration layer is deposited on a substrate which is n/p-codoped, i.e., both n-dopants and p-dopants are consciously incorporated in the calibration layer.

Generally, it should be noted that in the context of the application unless noted otherwise "doping" refers to a conscious doping of a layer using dopant sources and not to background doping due to impurities which are inadvertently incorporated in layers. As understood by persons skilled in the art, some amount of background doping virtually always is present. The n/p-codoping is performed such that the resulting layer is nominally un-doped, for example, based on a nominal specification of dopant sources or based on a previous calibration.

At 21, the actual dopant concentration is measured and n- and p-dopant sources are adjusted to minimize net doping, i.e., the overall doping. This essentially corresponds to the calibration already described with reference to FIG. 1, but may also be employed in other apparatuses than the one shown in FIG. 1.

At 22, a compensation device is manufactured based on the adjustment. Methods for manufacturing such compensation devices will be described later with reference to FIGS. 3 and 6. However, the manufacturing at 22 is not limited to the method of FIGS. 3 and 6, and other compensation devices may also be manufactured based on the adjustment, i.e., the above-described calibration of the n- and p-sources.

It should be noted that the calibration may be repeated when necessary, for example, after a certain amount of substrates for manufacturing compensation devices has been processed, after a certain time, or for example, based on a testing of the manufactured compensation devices.

Figure 3:
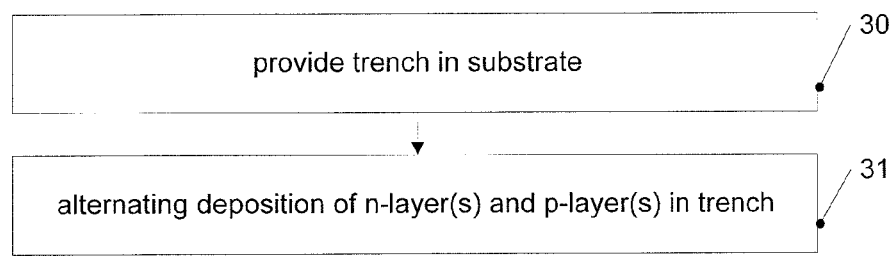
FIG. 3 shows a flowchart illustrating a method according to an embodiment.

In FIG. 3, an example for a method for manufacturing a compensation device based on the adjustment of 22 of FIG. 2 is shown. The method of FIG. 3 may be implemented in the apparatus of FIG. 1, but may be also implemented using other devices, techniques and apparatuses.

At 30, a trench is provided in a substrate, for example, by etching a trench in a substrate. The substrate may, for example, be a semiconductor wafer like a silicon wafer.

At 31, alternatingly one or more n-doped layers and one or more p-doped layers are deposited in the trench. In case of more than one n-doped layer and more than one p-doped layer, intermediate etching may be performed, for example, to ensure a contact between the substrate and the n-doped layers, between the substrate and the p-doped layers or between the substrate and both kinds of layers.

Figure 4:
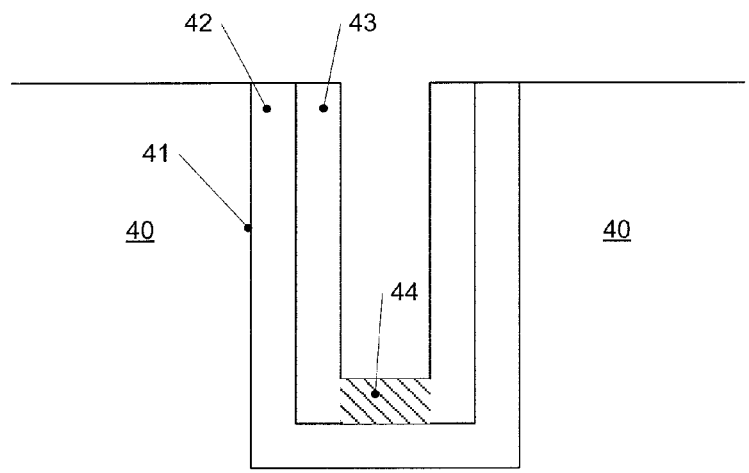
FIG. 4 shows a device manufactured in accordance with an embodiment.
Figure 5:
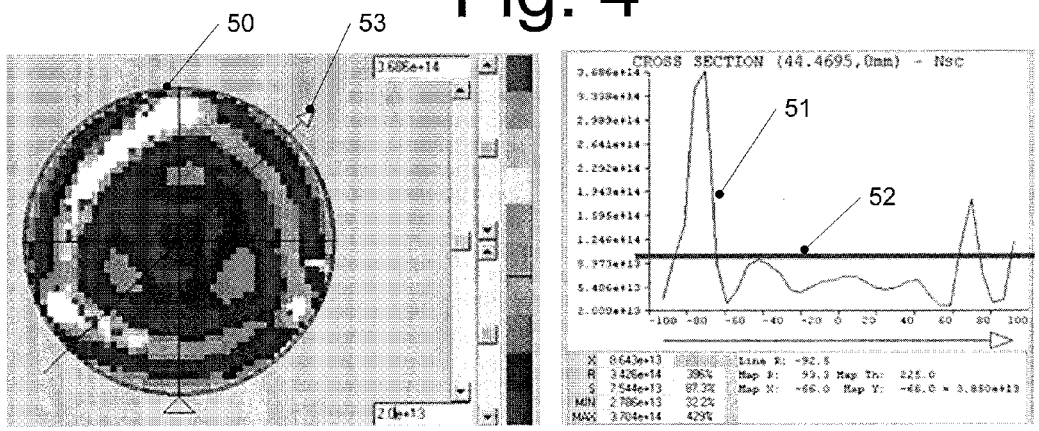
FIG. 5 shows measurement results for illustrating techniques employed in some embodiments.

In FIG. 4, a schematic view of a corresponding device which, e.g., may be manufactured using the method of FIG. 3 is shown. In a substrate 40, for example, a silicon wafer, other semiconductor wafers or also other types of substrates, a trench 41 is provided, e.g., via etching. In the trench, for example, by using a mask to limit the deposition to the trench, for example, an n-type epitaxy layer 42 followed by a p-type epitaxy layer 43 are deposited using a calibration as described above, such that the amount of n-type doping corresponds to the amount of p-type doping provided that the layer thicknesses are the same. As with many epitaxy apparatuses good control of the layer thickness, sometimes up to atomic level, may be given, this ensures a comparatively precise amount of compensation. In other embodiments, layer 42 may be a p-type layer, and layer 43 may be an n-type layer. In some embodiments, substrate 40 may be an n-type substrate or a substrate provided with an n-type layer. In other embodiments, substrate 40 may be a p-type substrate. According to other embodiments layer 42 and/or layer 43 may also be deposited and remain on an upper surface of substrate 40.

In some embodiments, the remaining trench may be filled with an un-doped epitaxy layer. In other embodiments, an air gap may remain. In yet other embodiments, following the deposition of layer 43 a further n-type layer (or p-type layer) followed by a further p-type layer (or n-type layer) may be deposited. This process may be repeated to provide a sequence of multiple n-type layers and p-type layers. In some embodiments, after each deposition of a p-type layer like layer 43, the p-type layer may be removed at the bottom of trench 41, for example, via an anisotropic etching. For example, a portion 44 of p-type layer 43 may be removed. In this way, a subsequently deposited n-type layer contacts substrate 40 via n-type layer 42. In other embodiments, n-type layers may be anisotropically etched to be removed at the bottom such that the p-type layers contact the substrate. In still other embodiments, an anisotropic etching may be performed after each layer deposition such that all layers contact the substrate. In this way, a compensation device having a plurality of vertically doped columns in a trench with precise compensation may be manufactured in some embodiments.

An integral net doping of the n- and p-layers may be each of the order of $2 \times 10^{12}/cm^2$ or less, and a layer thickness tolerance may be about 1%. Layer thicknesses may be in the order of 0.2 or 0.5 or one or two micrometers.

The doping of the n- and p-layers may be between $10^{16}/cm^3$ and $2 \times 10^{17}/cm^3$, although other concentrations are also possible. In FIG. 4, an example doping concentration over a wafer measured during calibration is shown. On the left side, a surface map 50 of the wafer is shown, different colors representing different doping levels. On the right side, a cross-section along an arrow 53 is shown. A calibration may, for example, be seen as complete when the net doping as represented by a curve 51 is below a predetermined threshold represented for example, by a line 52 at least over parts of the wafer which are later used for device manufacture (in some cases, e.g., some areas at or near the wafer edge may not be used). As already mentioned with respect to FIGS. 1 and 2, a calibration and adjustment may be repeated until the desired criterion, for example, a net doping below a certain threshold is achieved.

Figure 6:
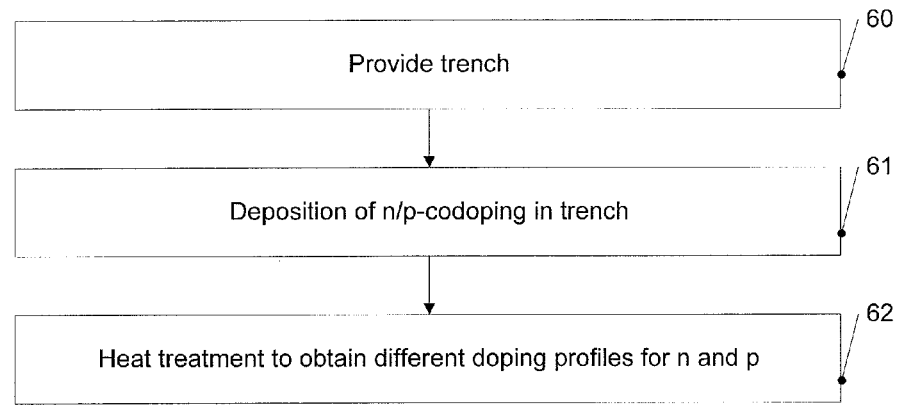
FIG. 6 shows a flowchart illustrating a method according to an embodiment.

In FIG. 6, a flowchart illustrating a further embodiment of manufacturing a compensation device is shown. The embodiment of FIG. 6 may be used as manufacturing method 22 of the embodiment of FIG. 2, but also may be used independently from the embodiment of FIG. 2, for example, in cases where dopant sources have been calibrated in a different manner than previously discussed.

At 60 in the embodiment of FIG. 6, a trench is provided in a substrate, for example, by etching the trench into the substrate like a silicon substrate. At 61, an n/p-codoped layer is deposited in the trench such that the overall net doping is below a desired threshold, which may be obtained by performing a calibration as described above in some embodiments. In the embodiment of FIG. 6, the n-dopant used has a different diffusion behavior than the p-dopant used. For example, a slowly diffusing donor, i.e., n-dopant, like arsenic (As) or antimony (Sb) may be used together with a fast-diffusing acceptor, i.e., p-dopant, for example, boron. When the layer is then heat-treated, the p-dopant diffuses faster than the n-dopant, resulting in an n-doped region sandwiched between p-doped regions with an overall net doping below the above-mentioned threshold, which then may be used in the compensation device.

At 62, based on the different diffusion behaviors a heat treatment is performed to obtain different doping profiles for n-doping and p-doping.

Figure 7:
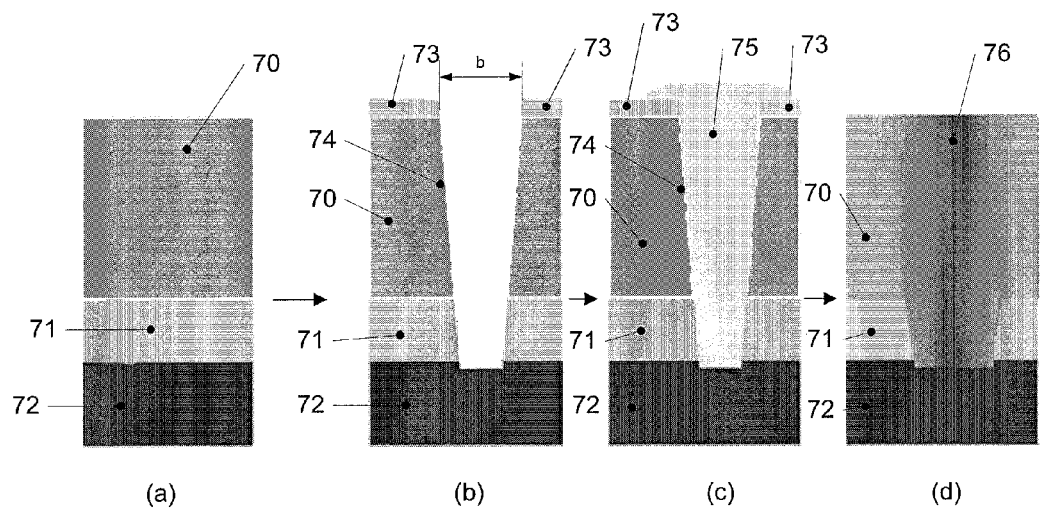
FIG. 7 is a schematic diagram illustrating a device according to an embodiment in various stages of a manufacturing process.

An illustration of such an embodiment together with a resulting device portion is schematically shown in FIG. 7. FIG. 7 is to be taken merely as a simple example for illustrating the method of FIG. 6 further, but is not to be construed as limiting the method of FIG. 6. FIG. 7 shows four stages (a) to (d) of manufacture which follow each other as indicated by arrows.

In stage (a), a preprocessed substrate is provided. As already mentioned initially, methods may be applied both to preprocessed substrates and to substrates without any preprocessing. The substrate provided in situation (a) comprises the semiconductor wafer 72 which may be a highly n-doped substrate, for example, an Antimony doped substrate, followed by an optional n-doped buffer 71. Buffer 71 is followed by a weakly doped layer 70, for example, a weakly n-doped layer. The overall thickness of n-doped buffer 71 and weakly doped layer 70 may be in the range from 30 to 60 micrometers, but is not limited thereto. In embodiments, a thickness $t_{tot}$ in μm of n-doped buffer 71 and weakly doped layer 70 may correspond to a desired blocking voltage $V_{Block}$ in Volts of a device to be manufactured according to:

$$t_{tot} = \frac{V_{block}[V]}{10 \ldots 20}$$

which means that for a device with a desired rated blocking voltage of, e.g., 600 V the thickness $t_{tot}$ may, e.g., be in a range of 30 μm to 60 μm.

By providing a buffer layer like buffer layer 71 in some embodiments a robustness of the device, for example, with respect to avalanche behavior or radiation behavior may be improved.

After this, a trench is etched into the substrate as shown in situation (b). To this end, a mask 73 may be provided leaving a width b of, for example, about 1 micrometer open. This defines the upper width of trench 74 as shown. In the embodiment of FIG. 7, the trench is etched to reach substrate 72. In other embodiments, trench 74 may end in optional buffer layer 71. In some embodiments, buffer layer 71 may have a doping variable in the vertical direction (up-down direction in FIG. 7) with a higher doping concentration being present near substrate 72.

Generally, a depth of the trench may be of the order of 42 micrometers. A distance to a next trench (not shown) if present may be about 4.5 micrometers. These numerical values serve only as examples, and other values may be used as well depending on the application.

Next, the trench is filled with a compensated epitaxy layer, i.e., with n/p-codoping where the amount of n-doping compensates the amount of p-doping and the n-dopant has a different diffusion behavior than the p-dopant. For example, as mentioned above a slower diffusing n-dopant and a faster diffusing p-dopant may be used. In the example of situation (c), the trench is completely filled with the compensated epitaxy layer 75 with a certain "overfill." In other embodiments, a defined cavity (for example, as shown in FIG. 4) may remain which may be filled with a weakly doped or intrinsic layer or which may be simply closed to prevent an outdiffusion of dopants.

Finally, the device is planarized as shown in situation (d), and a heat treatment is performed to cause diffusion of the dopants. In the example shown, the n-dopant has a significantly slower diffusion than the p-dopant. Therefore, an n-doped center region 76 remains (shown in darker grey in FIG. 7) surrounded by p-doped regions (shown in lighter grey).

For manufacturing, for example, a compensation device in form of a transistor, a cell of the transistor is adjusted such that a channel end reaches the vertical n-doped center 76 of the trench. The manufacturing illustrated in FIG. 7 may be used for stripe shaped, quadratic, hexagonal or other cells. Hexagonal cells and hexagonal trenches may be advantageous when small pitches, i.e., small distances between adjacent trenches are formed.

As the layer 75 is compensated, i.e., has the same amount of p-doping and n-doping, in the embodiment of FIG. 7 it is ensured that the net doping of the n-doped regions and p-doped regions formed by the diffusion is also compensated. When a plurality of trenches is used, in this way it is ensured that each trench is compensated.

A smaller pitch may be obtained in some embodiments by depositing compensation doped n/p-codoped and nominally un-doped layer alternatingly in a trench. A simple example for this will be explained with reference to FIG. 8.

In FIG. 8 again shows various stages or situations (a) to (d) of a device manufacturing process somewhat similar to the example of FIG. 7. In situation (a) a substrate 80 with a weakly doped layer 81 on top thereof is provided. In other words, in the example of FIG. 8 the buffer layer 71 of FIG. 7 is omitted. However, also in the example of FIG. 8 a buffer layer may be provided.

Figure 8:
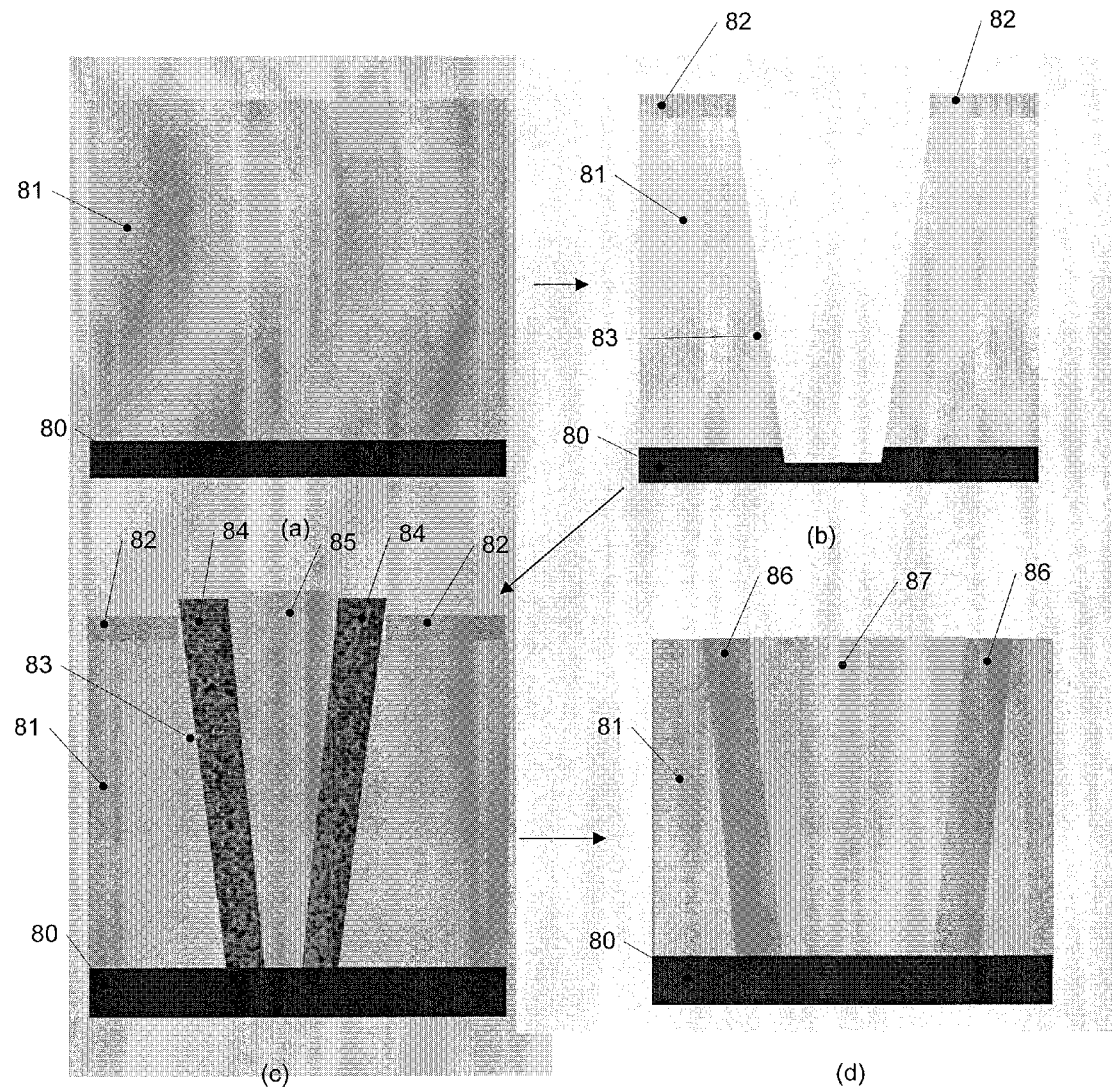
FIG. 8 is a schematic diagram showing a device according to a further embodiment in various stages of a manufacturing process.

In situation (b) of FIG. 8 similar to situation (b) of FIG. 7 a trench 83 has been etched reaching substrate 80 by using a mask 82. Following this, an n/p-codoped layer 83 is deposited in the trench followed by an intrinsic layer, i.e., a nominally un-doped layer, or weakly doped layer 85. It should be noted that while in FIG. 8 layer 85 completely fills the space between layers 84, in other embodiments only a thinner layer 85 may be deposited followed by a further n/p-codoped layer etc. It should further be noted that an anisotropic etching may be performed to remove the n/p-doped layer at the bottom of the trench, as already explained with reference to FIG. 4. Therefore, in case of situation (c) of FIG. 8 two n/p-codoped columns 84 are formed within a single trench. In other embodiments as mentioned above more columns may be formed.

Following a heat treatment, two columns 86 may be formed similar to the situation (d) in FIG. 7, each column 86 having an n-doped center region surrounded by p-doped regions (or vice versa, in case the n-dopant has a faster diffusion behavior than the p-dopant).

It should be noted that the various situations in FIGS. 7 and 8 are not necessarily drawn to scale with each other. Moreover, it should be noted that by the diffusion the actual area covered by the n- and p-doped regions may be wider than the original trench.

When reducing the pitch by depositing multiple columns of n/p-codoped material within a single trench as shown in FIG. 8, a specific resistance may be reduced. However, conversely, in some cases the area where the doping is intrinsically compensated may be increased in some cases.

For providing robust devices, in some embodiments the devices may be designed such that a possible breakthrough may happen about in the middle of the depth receiving voltage. To achieve this, the compensation degree may vary in the depth direction. For example, the compensation degree may behave according to $k(z)=2\times[(\text{number of n carriers})-(\text{number of p carriers})]/[(\text{number of n carriers})+(\text{number of p carriers})]$ in depth z with thickness dz, wherein k is the compensation degree. To achieve this, k(z) may increase starting from the surface towards the backside of the device starting from negative values. The overall compensation $$k = \int k(z) x dz$$

over the entire voltage receiving depth should be 0 to have a compensation element. To achieve this, in some embodiments the initial layer (70 of FIG. 7 or 81 of FIG. 8) may be doped accordingly, such that the lower half is for example n-doped and the upper half is p-doped, with a symmetric profile. However, in other embodiments this may be omitted, and layer 70 or 81 may be homogeneously doped.

To further illustrate the concept of FIGS. 6-8, FIG. 9 shows simulated doping profiles before and after a heating-induced diffusion. A curve 90 shows the doping profile of arsenic (n-dopant) and boron (p-dopant) deposited in a trench prior to a heat treatment. In the simulation example shown a trench with a width of 1 μm is etched into a Si substrate with a distance between two trenches of 4.5 μm. For symmetry reasons, the simulation area in FIG. 9 may be carried out using a half-cell, i.e., half of a trench and half of the remaining Si mesa have a width of 0.5 μm and 2.25 μm, respectively. The origin of the coordinate system is located in the middle of the Si mesa and laterally expands until the middle of the trench is reached at 2.75 μm. The amount of doping for both kinds of dopants is the same, i.e., the layer is compensated. A curve 94 shows a weak phosphorous doping in a layer into which the trench was etched, like layer 70 of FIG. 7 or layer 81 of FIG. 8, prior to heat treatment. In the simulation, then a heat treatment at 1,150° C. for 350 minutes was performed. After the heat treatment, a curve 91 shows the profile for arsenic, a curve 92 shows a profile for boron and a curve 94 shows the profile for phosphorous representing an original and almost negligible background doping of the Si mesa. As can be seen, boron diffuses faster than arsenic, leading to a higher arsenic concentration than boron concentration at the center of the trench and a lower arsenic concentration and higher boron concentration further away from the trench. Furthermore, curve 94 shows the phosphorous after diffusion, showing that some phosphorous diffuses into the region of the trench. The overall (absolute) doping is shown by the curve 93 showing a minimum at about 1.9 μm distance from a mesa center. To the right of this minimum, a net n-doping is present (as the arsenic concentration is higher than the boron concentration (note the logarithmic scale), while to the left of this minimum a net p-doping is present due to the higher boron concentration. The overall doping is compensated.

Figure 9:
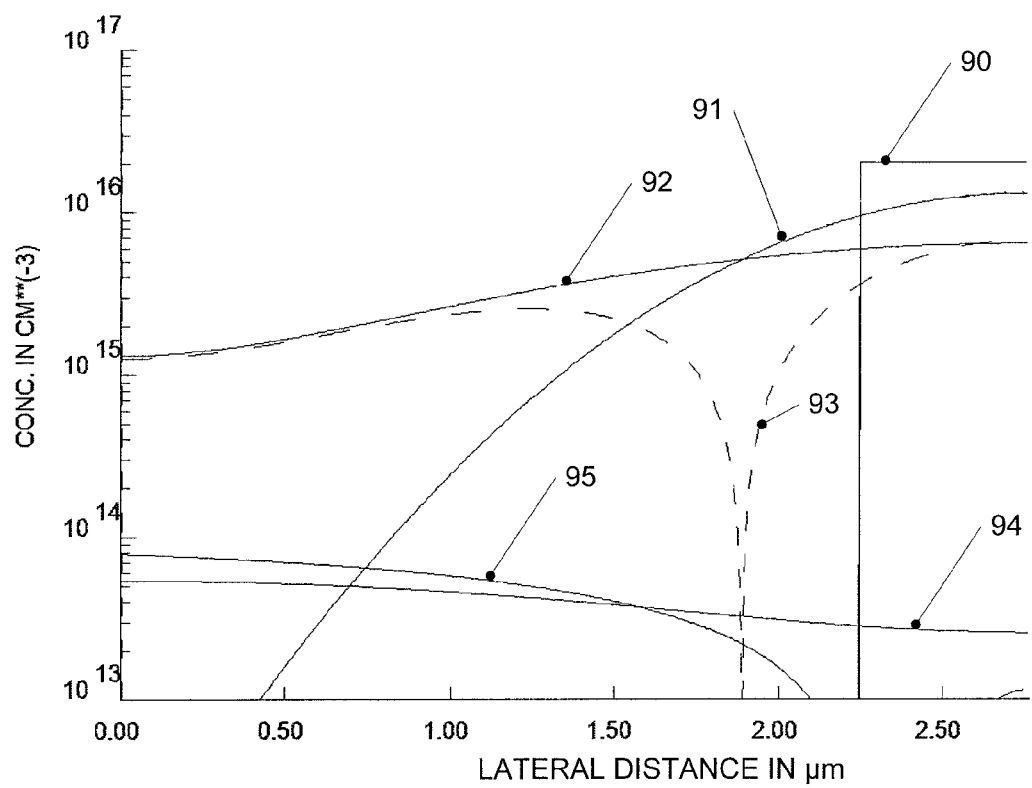
FIG. 9 shows doping profiles before and after a heat treatment.

FIG. 9 shows only the "left" side of the trench, i.e., one side of the trench. The full profile, as already discussed with reference to situation (b) in FIG. 7, would be essentially symmetric to the center of the trench located at 2.75 μm in FIG. 9 or would be essentially symmetric to the center of the mesa located at 0 μm in FIG. 9. Therefore, a doping profile results where the two dopants used in the n/p-codoped layer have a maximum at the same position (lateral distance in FIG. 9), but differ in magnitude, one dopant generally having a narrower profile with a higher maximum and the other dopant (curve 92 in FIG. 9) having a wider profile with a lower maximum.

The simulation of FIG. 9 merely serves for illustration, and of course other layer thicknesses, dopants, and structures may be used. Furthermore, any numerical values given in this disclosure serve only to give some examples, and other values are equally possible. Also, while various deposition techniques are described for depositing layers, other techniques to form these layers may also be used, for example, by using other layer forming apparatuses than epitaxy apparatuses. Also, trenches may be formed or provided using other techniques than etching. Therefore, the embodiments discussed are not to be construed as limiting the scope in any way.

What is claimed is:

1. A method comprising:
    forming an n/p-codoped calibration layer on a substrate; and
    adjusting supply of n-dopant and p-dopant based on a net doping of the n/p-codoped calibration layer.

2. The method of claim 1, further comprising forming n/p-codoped calibration layers on a plurality of substrates, at least one of a p-doping concentration or an n-doping concentration varying between substrates, wherein adjusting comprises determining a value of supply of n-dopant and p-dopant based on net dopings of the plurality of n/p-codoped calibration layers.

3. The method of claim 1, wherein forming and adjusting are repeated until a net doping of said calibration layer is below a predetermined threshold.

4. The method of claim 1, further comprising manufacturing a compensation device based on the adjustment.

5. The method of claim 4, wherein manufacturing the compensation device comprises alternatingly forming an n- and p-doped layer based on the adjustment.

6. The method of claim 4, wherein manufacturing the compensation device comprises forming at least one n/p-codoped layer based on the adjustment, said n-dopant and said p-dopant having different diffusion behavior, and performing a heat treatment.

7. The method of claim 4, wherein manufacturing said compensation device comprises forming at least one layer in a trench.

8. The method of claim 1, further comprising measuring a net doping of the n/p-codoped calibration layer, wherein adjusting of the supply of n-dopant and p-dopant is based on the measured net doping.

9. A method comprising:
    providing a trench in a substrate;
    forming at least one n/p-codoped layer in said trench, wherein an n-dopant of said n/p-codoping has a different diffusion behavior from a p-dopant of said n/p-codoping; and
    performing a heat treatment to obtain different doping profiles for said n-dopant and said p-dopant.

10. The method of claim 9, wherein forming of said n/p-codoped layer comprises depositing at least two separated n/p-codoped layers in said trench.

* * * * *